United States Patent [19]

Kaneko et al.

[11] Patent Number: 5,122,889
[45] Date of Patent: Jun. 16, 1992

[54] ACTIVE MATRIX LIQUID CRYSTAL DISPLAY USING MIM DIODES HAVING SYMMETRICAL VOLTAGE-CURRENT CHARACTERISTICS AS SWITCHING ELEMENTS

[75] Inventors: Setsuo Kaneko; Hiroyuki Uchida; Yoshihiko Hirai; Kousaku Ohira, all of Tokyo, Japan

[73] Assignee: NEC Corporation, Tokyo, Japan

[21] Appl. No.: 455,259

[22] Filed: Dec. 22, 1989

[30] Foreign Application Priority Data

Dec. 22, 1988 [JP] Japan .................. 63-325206
Dec. 22, 1988 [JP] Japan .................. 63-325207
Dec. 22, 1988 [JP] Japan .................. 63-325208

[51] Int. Cl.⁵ .................................... G02F 1/13
[52] U.S. Cl. ............................. 359/60; 359/54; 359/58; 359/87; 357/4; 357/58
[58] Field of Search ............... 350/333, 334, 336; 357/2, 58, 4; 340/784

[56] References Cited

U.S. PATENT DOCUMENTS

| | | | |
|---|---|---|---|
| 4,589,733 | 5/1986 | Yaniv et al. | 350/333 |
| 4,591,892 | 5/1986 | YAmazaki et al. | 357/58 |
| 4,704,624 | 11/1987 | Yamazaki et al. | 357/58 |
| 4,728,172 | 3/1988 | Cannella | 350/333 |
| 4,741,601 | 5/1988 | Saito | 357/2 |
| 4,820,024 | 4/1989 | Nishiura | 350/336 |
| 4,828,370 | 5/1989 | Suzuki | 350/333 |
| 4,855,805 | 8/1989 | Yamazaki et al. | 350/336 |
| 4,907,040 | 3/1990 | Kobayashi et al. | 307/4 |
| 4,983,022 | 1/1991 | Shannon | 350/333 |

OTHER PUBLICATIONS

"A 250×240-Element Lateral MIM-LCD", S. Morozumi et al., Technical Report Television Society of Japan pp. 39–44 (Dec. 1983).

"A New Active Diode Matrix LCD Using Off-Stoichiometric $SiN_x$ Layer", Suzuki et al., Proceedings of SID, vol. 28/2, pp. 101–104, (1987).

"The Optimization of Metal-Insulator-Metal Nonlinear Devices for Use in Multiplexed Liquid Crystal Displays", Bariff et al., IEEE Transactions on Electron Devices, vol. ED-28, No. 6, pp. 736–739 (Jun. 1981).

Primary Examiner—Rolf Hille
Assistant Examiner—Minhloan Tran
Attorney, Agent, or Firm—Burns, Doane, Swecker & Mathis

[57] ABSTRACT

In thin film two terminal element type active matrix liquid crystal displays obtained by holding liquid crystal between a substrate on which is formed a transparent electrode and a substrate on which is formed in matrix form thin film two terminal elements having a metal-insulator-metal structure using a silicon nitride film as the insulator, the active matrix liquid crystal display characterized in that an impurity-doped silicon nitride layer or a silicon carbide layer is inserted between the metal and the insulator.

32 Claims, 3 Drawing Sheets

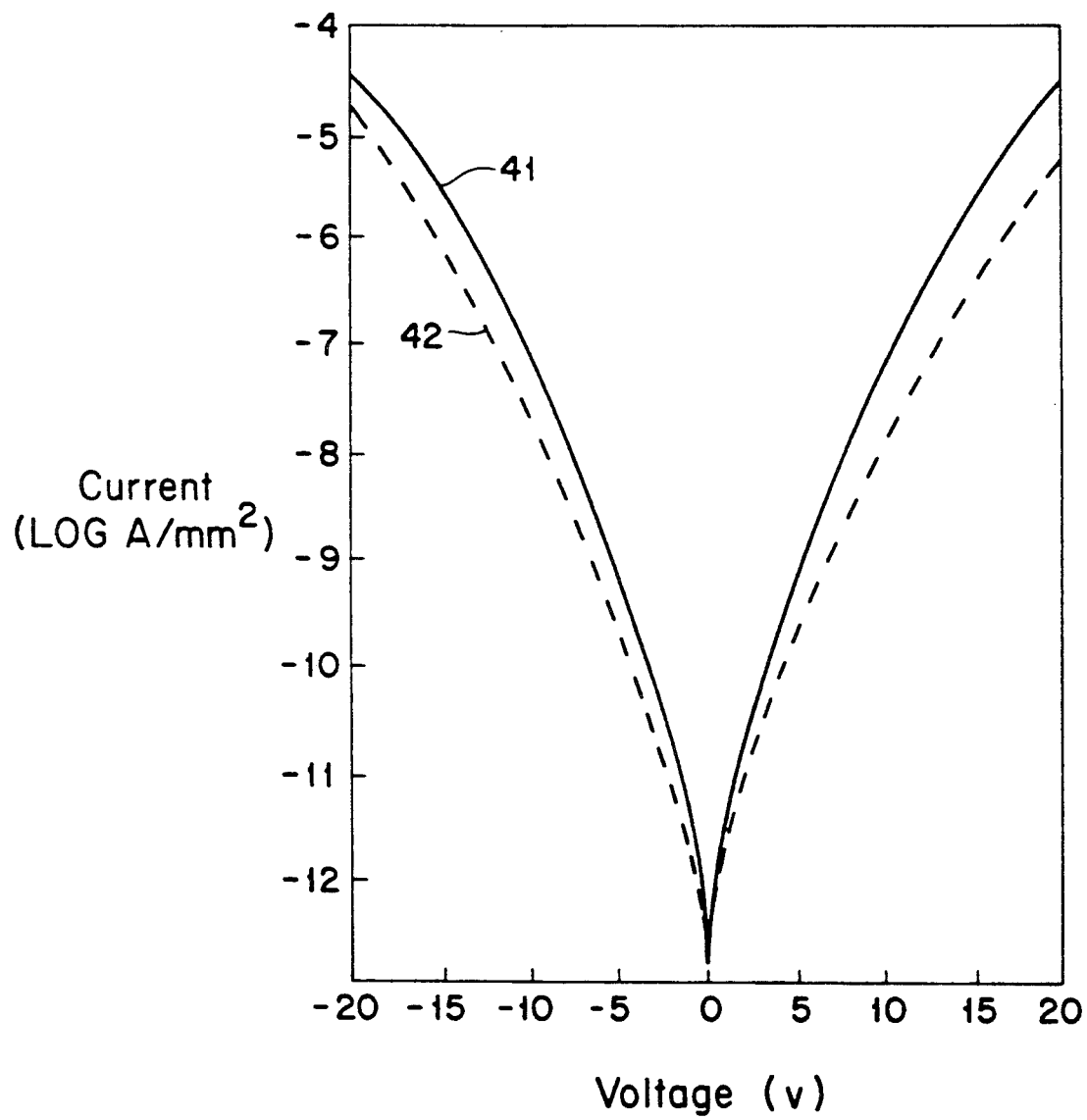

ACTIVE MATRIX LIQUID CRYSTAL DISPLAY USING MIM DIODES HAVING SYMMETRICAL VOLTAGE-CURRENT CHARACTERISTICS AS SWITCHING ELEMENTS

BACKGROUND OF THE INVENTION

1. Field of the Invention

The present invention relates to an active matrix liquid crystal display, and more particularly to an active matrix liquid crystal display that makes use of a thin film two-terminal element consisting of a metal-insulator-metal structure.

2. Description of the Related Art

In recent years, applications of liquid crystal displays (LCDs) centered around those of the twisted nematic type have been expanded, and the LCDs are currently being used in large quantities in such fields as wrist watches and hand calculators. In addition, use of matrix type LCDs which make it possible to display characters, graphics and the like in an arbitrary fashion by the matrixlike arrangement of the pixels has also been introduced lately. In order to expand the applications of the LCDs, it is mandatory to increase the display capacity. Now, the rise of the voltage-transmissivity change characteristic of the conventional LCDs is not steep enough. Therefore, when the number of scanning lines for multiplexed drive is increased in order to enhance the display capacity, the ratio of the effective voltages that are applied to the selected pixels and the nonselected pixels is reduced, giving rise to crosstalks in which the transmissivity for the selected pixels is decreased while the transmissivity for the nonselected pixels is increased. As a result, the display contrast undergoes a marked decrease with the view angle for which tolerable contrast can be obtained is also narrowed, which limit the number of the scanning lines of the conventional LCDs up to around 60 lines.

For the purpose of remarkably enhancing the display capacity of the matrix type LCDs, there have been contrived active matrix LCDs in which a switching element is serially arranged to each of the pixels of the LCDs. The switching element for the trial fabrications of the active matrix LCDs disclosed so far mostly makes use of thin film transistors (TFTs) which employ amorphous silicon or polycrystalline silicon as the semiconductor material. On the other hand, active-matrix LCDs using thin-film two terminal elements (abbreviated as TFDs hereinafter) for which fabrication steps can be simplified and high yield and low cost can be expected due to relatively simple fabrication and structure are also drawing attention.

The LCD among such thin film two terminal element type active matrix LCDs (abbreviated as TFD-LCD hereinafter) which is considered to be most promising for practical application is the one which employs a metal-insulator-metal element (abbreviated as MIM element or simply MIM hereinafter) for the TFD. By connecting a TFD such as an MIM in series to the liquid crystal for each pixel, the rise in the voltage-transmissivity change characteristic of the TFD liquid crystal element can be made steep due to the high nonlinearity of the voltage-current characteristic of the TFD. This enables one to increase the number of scanning lines of the liquid crystal display.

Such a prior art example is disclosed typically in D. R. Baraff et al., "The Optimization of Metal-Insulator-Metal Nonlinear Devices for Use in Multiplexed Liquid Crystal Displays", IEEE Trans. Electron Devices, Vol. ED-28, pp. 736-739 (1981).

The most important material in MIM elements is that of the insulator layer. The most widely known insulator material is tantalum oxide (see, for example, S. Morozumi et al., "Lateral MIM-LCD with 250×240 Pixels," Technical Report of the Television Society of Japan (IPD 83-8), pp. 39-44, December 1983). The characteristics that are required in applying such an MIM element to a large-capacity display are that the nonlinearity coefficient α in the expression for the current (I) flowing in the element given in the form of $I = aV^{\alpha}$ in terms of the applied voltage (V) is large, that the current-voltage characteristic is symmetric with respect to the applied voltage regardless of its polarity, and that the capacity of the MIM element is small. Now, MIM elements using tantalum oxide have weaknesses in that the nonlinearity coefficient is in the range of 5 to 6 which is not sufficiently large, although the symmetry is satisfactory, the element capacity is large due to large permittivity, and the like. Because of this, silicon nitrides that have small permittivity have been developed as the insulator material for MIM elements (see, for example, M. Suzuki et al., "A New Active Diode Matrix LCD Using Off-Stoichiometric $SiN_x$ Layer," Proceedings of the SID, Vol. 28, pp. 101-104 (1987)).

Although the MIM elements using silicon nitrides have nonlinearity coefficient in the range of 7 to 9 which is larger than that of tantalum oxide, their voltage-current characteristic often take on asymmetric forms that depend on the polarity of the applied voltage as shown by the broken like 22 in FIG. 2. The current-voltage nonlinearity characteristic of MIM diode depends on the Poole-Frenkel carrier conduction of the bulk insulator and Schottoky barrier of metal insulator interface. This current-voltage asymmetric characteristic is due to the carrier injection difference between the bottom metal-insulator interface and the upper metal-insulater interface in the MIM structure. This carrier-injection difference is due to the formation of different kinds of modified layers (high resistance oxide layers) between the bottom and upper metal-insulator interface. As a result, when the MIM elements are utilized in liquid crystal displays, there occur flickers which bring about deterioration in the quality of pictures.

SUMMARY OF THE INVENTION

It is, therefore, an object of the present invention to provide a large-capacity liquid crystal display with high picture quality by ameliorating the assymetry of the voltage-current characteristic of the MIM element which brings about the deterioration in the quality of pictures.

The liquid crystal display of the present invention includes lower substrate, a plurality of first electrodes formed on the lower substrate, a plurality of impurity-doped first silicon nitride films or a plurality of imppurity-doped first silicon carbide films formed on the first electrodes, a plurality of second silicon nitride films formed on the first silicon nitride films or the first silicon carbide films, a plurality of impurity-doped third silicon nitride films or a plurality of impurity-doped second silicon carbide films formed on the second silicon nitride films, a plurality of second electrodes formed on the third silicon nitride films or the second silicon carbide films, a plurality of pixel electrodes formed on the lower substrate, being electrically connected to the respective second electrodes, an upper substrate formed on the lower substrate, a transparent electrode formed on the upper substrate, and a liquid crystal provided between the pixel electrodes and the transparent electrode.

Since impurity-doped low resistance silicon nitride films or silicon carbide films are formed between the second silicon nitride film and the first and the second electrodes, respectively, high resistance layers are no longer formed between the second silicon nitride films and the first and the second electrodes, the carrier injection from the respective electrodes to the second silicon nitride films is facilitated. Therefore, the current voltage nonlinearlity characteristic of MIM diode becomes to be mainly determined by the bulk Poole-Frenkel conduction of the second silicon nitride films, and the asymmetry in the voltage current characteristics can be prevented from arising.

As impurities for doping, use is made of a p-type impurity such as boron, an n-type impurity such as phosphorus, or impurities of both of p-type and n-type.

As the concentration of doping, in order to keep the resistivity of the first and third silicon nitride films and the first and second silicon carbide films in the range of $10^7$ to $10^3$ $\Omega$-cm, it is preferable to be larger than 500 ppm and smaller than 1% when boron is used as the impurity, and it is preferable to be larger than 100 ppm and smaller than 1% when phosphorus or the combination of boron and phosphorus is used as the impurity.

The atomic concentration of nitrogen in the first and third silicon nitride is preferable to be larger than 2% and smaller than 40%, the concentration of carbon in the first and second silicon carbide films is preferable to be larger than 2% and smaller than 40%, and the concentration of nitrogen in the second silicon nitride films is preferable to be larger than 10% and smaller than 40%.

The film thicknesses of the first and third silicon nitride films and the first and second silicon carbide films are preferable to be larger than 30 Å and smaller than 500 Å. The reason for the upper limit is that when the film thickness is larger than 500 Å, the leakage current due to lateral expansion of the electric field becomes too large. The film thickness of the second silicon nitride films is preferable to be larger than 500 Å and smaller than 3000 Å. The reason for the upper limit is that when it becomes larger than 3000 Å, current as an MIM element is difficult to flow.

As the impurity-doped films to be provided between the second silicon nitride films and the first and second electrodes, the silicon nitride films are preferred to the silicon carbide films. In the case of employing the silicon carbide films, the fabrication process becomes complicated such as the necessity for changing the species of the starting gas. In contrast, in the case of using the silicon nitride films, the fabrication process will not become complicated since no change of the starting gas species is required.

BRIEF DESCRIPTION OF THE DRAWINGS

The above and further objects, features and advantages of the present invention will become more apparent from the following detailed description taken in conjunction with the accompanying drawings, wherein:

FIG. 4 is a diagram showing the voltage-current characteristic of the thin film two terminal element according to a third embodiment of the present invention and the conventional thin film two terminal element.

DESCRIPTION OF THE PREFERRED EMBODIMENTS

First Embodiment

Figure 1:
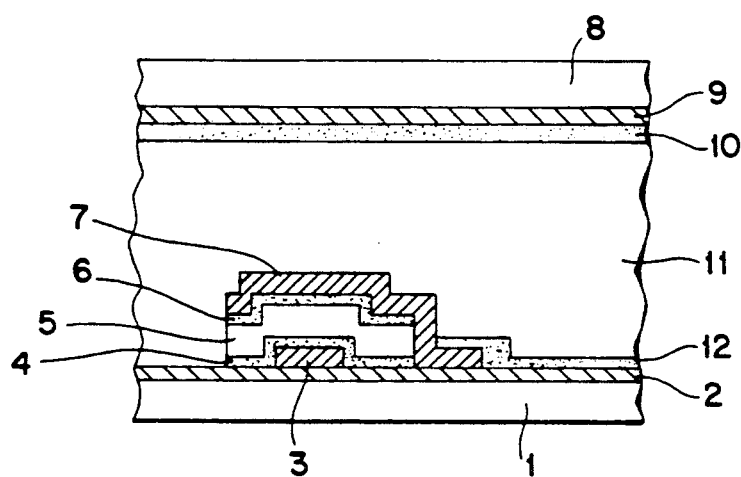
FIG. 1 is a sectional view for illustrating the embodiments of the liquid crystal display panels of the present invention.

A typical sectional view of the TDF elements obtainable by the present invention is shown in FIG. 1. First, a lower glass substrate 1 is coated with a glass protective layer 2 of $SiO_2$ or the like. Since the protective layer 2 is not indispensable, it can be omitted. Next, a 1000 Å thick Cr layer is formed on top of it as a metal electrode, and a lead electrode 3 is formed in island form by patterning using the photolithographic technique. Subsequently, a phosphorus (or arsenic)-doped first silicon nitride layer 4 is formed on the glass substrate by the glow discharge decomposition process using a mixture of gaseous $SiH_4$ and gaseous $N_2$ to which is mixed 0.5% of gaseous $PH_3$ or gaseous $AsH_3$. Continuing to form a 1200 Å-thick silicon nitride layer 5 from the mixed gas of $SiH_4$ and $N_2$ and a 200 Å-thick phosphorus- or arsenic-doped second silicon nitride layer 6 using the mixed gas of $SiH_4$ and $N_2$ to which is mixed 0.3% of gaseous $PH_3$ or gaseous $AsH_3$, the formation of a three-layered structure is completed. In this case, the gas mixing ratio $SiH_4/N_2$ in forming the silicon nitride layer was 0.08, and the gas mixing ratio $SiH_4/N_2$ in forming the phosphorus- or arsenic-doped first and the second silicon nitride films was 0.2. Then, a MIM element is fabricated by forming a 1000 Å-thick Cr layer as an upper electrode 7 and patterning by the photolithographic technique. Next, indium-tin-oxide (ITO) is patterned as a pixel electrode 12. The film formation and patterning of a protective layer 9 and an upper transparent electrode 10 on an upper glass substrate 8 are carried out substantially identically to those of the simply multiplexed LCDs. The lower glass substrate 1 and the upper glass substrate 8 are laminated with a spacer such as glass fiber in between after providing them an orientation treatment, and sealed with an ordinary epoxy adhesive. The thickness of the cell was set at 5 $\mu$m. then, a TFD-LCD was completed by injecting ZLI-1565 (made by Merck Corp.) which is a TN-type liquid crystal 11.

Figure 2:
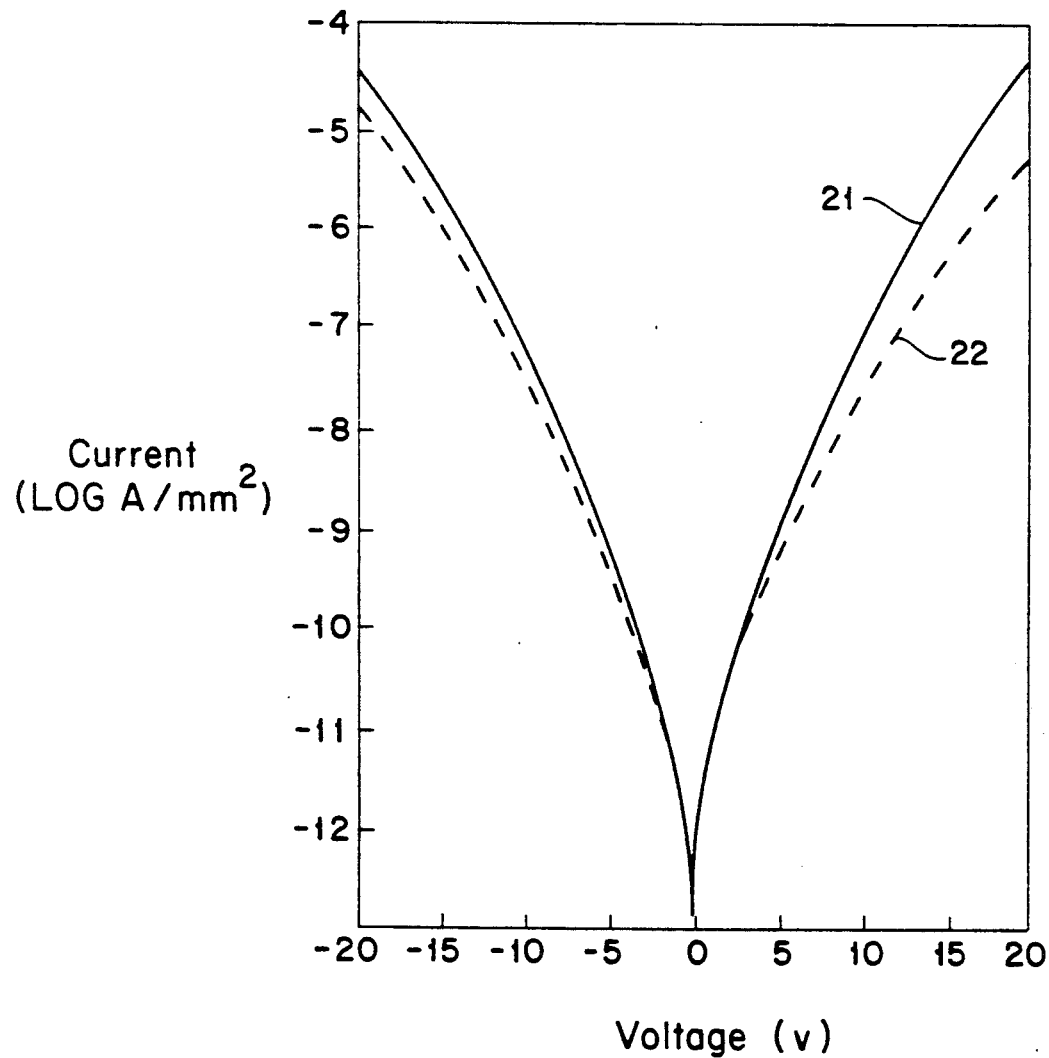
FIG. 2 is a diagram showing the voltage-current characteristic of the thin film two terminal element according to a first embodiment of the present invention and the conventional thin-film two terminal element.

A measurement of the voltage-current characteristic of the two terminal element formed in accordance with the present embodiment revealed that it is symmetric with respect to the polarity of the applied voltage as shown by the solid line 21 in FIG. 2, indicating an improvement both in the symmetry and the nonlinearity over those of the voltage-current characteristiic (broken line 22) of the conventional two terminal element obtained by the single layer structure of silicon nitride. In addition, the nonlinearity coefficient $\alpha$ was a large value of 8, and it was found that it is adaptable to TFD- LCDs with large scanning line number of larger than 1000.

A gas mixing ratio $SiH_4/N_2$ larger than 0.02 and smaller than 0.6 was found necessary in order to obtain two-terminal elements with large nonlinearity. Further, the gas mixing ratio $SiH_4/N_2$ for forming the first and the second silicon nitride layers doped with phosphorus or arsenic was larger than 0.01, and it was found that phosphorus or arsenic was effective in bringing about the symmetry of the voltage-current characteristic as long as its mixing ratio is larger than 10 ppm. It should be noted that although the silicon nitride layers were formed by using a mixed gas of $SiH_4$ and $N_2$ in the present embodiment, satisfactory diode characteristic can also be obtained by using a mixed gas of $SiH_4$ and $NH_3$ or a mixed gas of $Si_2N_6$ and $N_2$.

Moreover, use was made of silicon nitride layers doped with phosphorus or arsenic in the present embodiment. However, it was confirmed that voltage-current characteristic with satisfactory symmetry can also be obtained by adopting a three-layered structure formed by sandwiching a silicon nitride layer with phosphorus or arsenic-doped silicon carbide layers. In this case, silicon carbide films were formed by decomposing a gas with mixing ratio $SiH_4/CH_4$ larger than 0.1 with glow discharge.

From a picture evaluation of a TFD-LCD with 640 × 400 elements formed according to the present embodiment, it was found that the contrast is more than 20:1 and the flickers were −39 dB, indicating a marked improvement over the flickers of −25 dB of the conventional TFD-LCD with silicon nitride single layer structure.

Second Embodiment

Referring again to FIG. 1, first, a lower glass substrate 1 is coated with a glass protective layer 2 of $SiO_2$ or the like. The protective layer 2 is not mandatory so that it can be omitted if so desired. Next, Cr is formed on top of it as a metal electrode to a thickness of 1000 Å, and a lead electrode 3 is formed by photolithographic process patterned in island form. Subsequently, after forming a 500 Å-thick boron-doped first silicon nitride layer 4 on the glass substrate by the glow discharge decomposition method using a gas obtained by mixing 1% of gaseous $B_2H_6$ to a mixed gas of gaseous $SiH_4$ and gaseous $N_2$, a three-layered structure is obtained by forming a 1200 Å-thick silicon nitride layer 5 from a mixed gas of $SiH_4$ and $N_2$ and a 200 Å-thick boron-doped second silicon nitride layer 6 by using a gas obtained by mixing 0.5% of gaseous $B_2H_6$ to a mixed gas of $SiH_4$ and $N_2$. In this case, the gas mixing ratio $SiH_4/N_2$ in forming the silicon nitride layer was 0.08, and the gas mixing ratio $SiH_4/N_2$ in forming the boron-doped first and second silicon nitride layers was 0.2. Then, Cr is formed as an upper electrode 7 to a thickness of 1000 Å and patterned by the photolithographic technique to obtain a MIM element. Following that, a pixel electrode 12 is formed by patterning ITO. The film formation and patterning of a protective layer 9 and an upper transparent electrode 10 on an upper substrate 8 are carried out substantially identically to those of the simply multiplexed LCDs. The lower substrate 1 and the upper substrate 8 are laminated with a spacer such as glass fiber in between after being provided with an orientation treatment, and sealed with an ordinary epoxy adhesive. The thickness of the cell was set at 5 μm. Then, a TFD-LCD is completed by injecting ZLI-1565 (manufactured by Merck Corp.) which is a TN-type liquid crystal 11 between the substrates.

Figure 3:
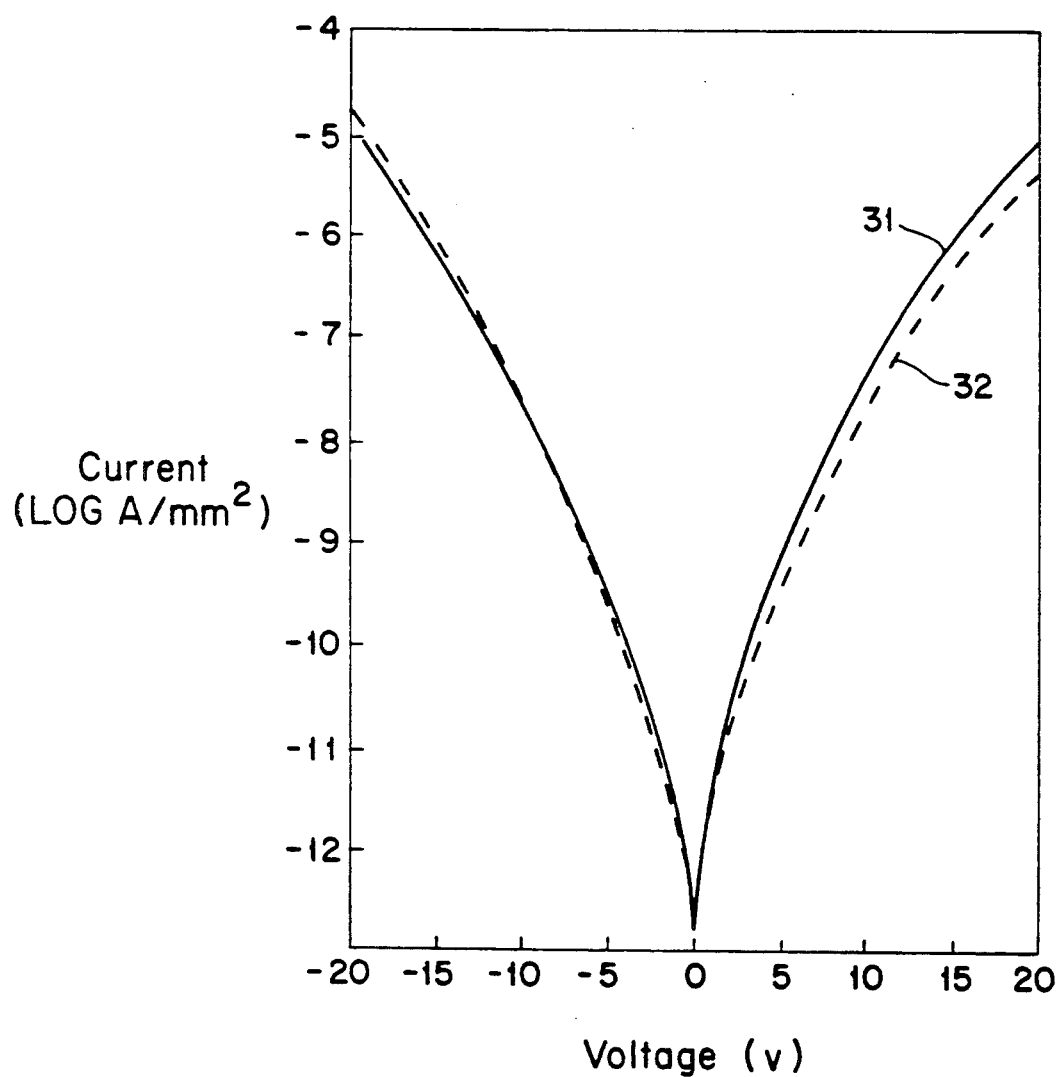
FIG. 3 is a diagram showing the voltage-current characteristic of the thin film two terminal element according to a second embodiment of the present invention and the conventional thin film two terminal element.

From a measurement of the voltage-current characteristic of the two terminal element formed according to the present embodiment, it was found that it is more symmetric with respect to the polarity of applied voltage as shown by the solid line 31 in FIG. 3 and that the symmetry was improved over that of the voltage-current characteristic (broken line 32) of the conventional two terminal element obtained by the silicon nitride single layer structure. Further, it was found that the nonlinearity coefficient α is also a large value of 8 which makes the two-terminal element adaptable to TFD-LCDs with large number of scanning lines of more than 1000.

The gas mixing ratio $SiH_4/N_2$ of larger than 0.02 and smaller than 0.6 was found necessary for obtaining two-terminal elements with large nonlinearity. In addition, the gas mixing ratio $SiH_4/N_2$ for forming the boron-doped first and second silicon nitride layers was larger than 0.01, and boron was effective for enhancing the symmetry of the voltage-current characteristiic when its mixing ratio is larger than 50 ppm. It should be noted that the films of silicon nitride layers were formed by using a mixed gas of $SiH_4$ and $N_2$. However, satisfactory diode characteristics were also obtained by using a mixed gas of $SiH_4$ and $NH_3$.

Further, although boron-doped silicon nitride layers were used in the present embodiment, diode characteristics with satisfactory symmetry were also obtained by using a three-layered structure formed by sandwiching a silicon nitride layer with boron-doped silicon carbide layers. In this case, silicon carbide layers were formed by the glow discharge decomposition method of a gas with mixing ratio $SiH_4/CH_4$ which is larger than 0.1.

From a picture quality evaluation of a TFD-LCD with 640×400 elements formed according to the present embodiment, it was found that the contrast was higher than 20:1, and the flickers were −37 dB which is a marked improvement over the value of −25 dB for the conventional TFD-LCD with a single layer structure of silicon nitride.

Third Embodiment

Referring again to FIG. 1, first, a lower glass substrate 1 was coated with a glass protective layer 2 of $SiO_2$ or the like. Since the protective layer 2 is not mandatory it may be omitted if so desired. Next, Cr is formed on top of it as a metallic electrode to a thickness of 1000 Å, and a lead electrode 3 is formed by patterning it in island form by the photolithographic technique. Subsequently, after forming a first silicon nitride layer 4 doped with an n-type impurity (phosphorous) and a p-type impurity (boron) to a thickness of 500 Å on the glass substrate by the glow discharge decomposition method by using a gas obtained by mixing 0.5% of gaseous $PH_3$ and 1% of gaseous $B_2H_6$ to a mixed gas of gaseous $SiH_4$ and gaseous $N_2$, a three-layered structure is obtained by forming a silicon nitride layer 5 to a thickness of 1200 Å from a mixed gas of $SiH_4$ and $N_2$, and a second silicon nitride layer 6 doped with an n-type impurity and a p-type impurity to a thickness of 200 Å by using a gas obtained by mixing 0.2% of gaseous $PH_3$ and 0.2% of gaseous $B_2H_6$ to a mixed gas of $SiH_4$ and $N_2$. In so doing, the gas mixing ratio $SiH_4/N_2$ for obtaining the silicon nitride layer was 0.08, and the gas mixing ratio $SiH_4/N_2$ for forming the phosphorus- and boron-doped first and second silicon nitride layers was 0.2. Then, Cr, is formed as an upper electrode 7 to a thickness of 1000 Å, and an MIM element array is formed by patterning it by the photolithographic technique. Next, ITO is patterned to form a pixel electrode 12. The film formation and patterning of a protective layer 9 and an upper transparent electrode 10 on an upper glass substrate 8 are carried out in substantially identical fashion as those of the ordinary simply multiplexed LCDs. The lower glass substrate 1 and the upper glass substrate 8 are laminated with a spacer such as glass fiber in between after being given an orientation treatment, and are sealed with the ordinary epoxy adhesive. The cell thickness was set at 5 μm. Then, ZLI-1565 (manufactured by Merck Corp.) which is a TN-type liquid crystal 11 is injected between the substrates, completing a TFD-LCD.

From a measurement of the voltage-current characteristic of the two-terminal element formed according to the present embodiment, it was found that the characteristic curve is symmetric with respect to the applied voltage as shown by the solid line 41 in FIG. 4, and that the symmetry was improved over that of the voltage-current characteristic (broken line 42) of the conventional two-terminal element obtained by a single layer structure of silicon nitride. Moreover, it was found that the nonlinearity coefficient $\alpha$ is a large value of 8 such that it is adaptable to TFD-LCDs with large number of scanning lines of more than 1000.

The gas mixing ratio $SiH_4/N_2$ for forming the silicon nitride layer of the two-terminal element, of larger than 0.02 and smaller than 0.6 is required for obtaining two-terminal elements with large nonlinearity. In addition, the gas mixing ratio $SiH_4/N_2$ for forming boron- and phosphorus-doped first and second silicon layers was larger than 0.01, and phosphorus and boron were effective for enhancing the voltage-current characteristic when their mixing ratios are larger than 10 ppm. Further, the use of arsenic in place of phosphorus was also effective. It is to be noted that the silicon nitride layer was formed by using a mixed gas of $SiH_4$ and $N_2$. However, satisfactory diode characteristics were also obtained by the use of a mixed gas of $SiH_4$ and $NH_3$.

Further, silicon nitride layer doped with an n-type impurity and a p-type impurity was used in the present embodiment. However, diode characteristics with satisfactory symmetry were also obtained by the use of a three-layered structure obtained by sandwiching a silicon nitride film with silicon carbon layers doped with the n-type impurity and the p-type impurity obtained in the similar way as above. In so doing, silicon carbide layers were formed using a gas with mixing ratio $SiH_4/CH_4$ larger than 0.1.

From a picture evaluation of a TFD-LCD with 640×400 elements formed according to the present embodiment, it became clear that the contrast is more than 20:1, and the flickers were −37 dB which is a marked improvement over the value of −25 dB of the conventional TFD-LCD with a single layer structure of silicon nitride.

Further, it should be noted that the three-layered structure of the MIM was formed by means of the glow discharge decomposition method in the above-mentioned embodiments. However, the present invention is also effective in other film forming methods such as the sputtering method and the CVD method.

Moreover, chromium was used as the electrodes in the embodiments described in the above, but the present invention is also effective by the use of other metals such as Al, Ta, and W and their silicides for the upper electrode and the lead electrode. In addition, the present invention is also effective when the transparent electrode of ITO or the like used as the pixel electrode is served also as the upper and the lower electrodes for the two terminal element.

What is claimed is:

1. A liquid crystal display comprising:
   a lower substrate;
   a plurality of first electrodes formed on said lower substrate;
   one of a plurality of impurity-doped first silicon nitride films and a plurality of impurity-doped first silicon carbide films, formed on said plurality of first electrodes;
   a plurality of second silicon nitride films formed on said one of said plurality of first silicon nitride films and said plurality of first silicon carbide films;
   one of a plurality of third silicon nitride films doped with said impurity and a plurality of second silicon carbide films doped with said impurity, formed on said plurality of second silicon nitride films;
   a plurality of second electrodes formed on said one of said plurality of third silicon nitride films and said plurality of second silicon carbide films and covering side surfaces of said one of said plurality of impurity-doped first silicon nitride films and said plurality of impurity-doped first silicon carbide films, said plurality of second silicon nitride films, and said one of said plurality of third silicon nitride films and said plurality of second silicon carbide films;
   a plurality of pixel electrodes formed on said lower substrate, said pixel electrodes being electrically connected respectively to said plurality of second electrodes;
   an upper substrate formed above said lower substrate;
   a transparent electrode formed on said upper substrate; and
   a liquid crystal provided between said pixel electrodes and said transparent electrode.

2. A liquid crystal display as claimed in claim 1, wherein said plurality of second silicon nitride films are undoped silicon nitride films.

3. A liquid crystal display as claimed in claim 1, wherein said impurity is a p-type impurity such as boron.

4. A liquid crystal display as claimed in claim 3, wherein said impurity is boron, a concentration of said boron being larger than 500 ppm and smaller than 1%.

5. A liquid crystal display as claimed in claim 1, wherein said impurity is an n-type impurity comprising one of phosphorus and arsenic.

6. A liquid crystal display as claimed in claim 5, wherein said impurity is phosphorus, a concentration of said phosphorus being larger than 100 ppm and smaller than 1%.

7. A liquid crystal display as claimed in claim 1, wherein said impurity is a combination of a p-type impurity such as boron and an n-type impurity comprising one of phosphorus and arsenic.

8. A liquid crystal display as claimed in claim 7, wherein said impurity is a combination of boron and phosphorus, a concentration of said impurity being larger than 100 ppm and smaller than 1%.

9. A liquid crystal display as claimed in claim 1, wherein the concentrations of nitrogen in said pluralities of first and third silicon nitride films are larger than 2% and smaller than 40%, the concentrations of carbon in said pluralities of first and second silicon carbide films are larger than 2% and smaller than 40%, and the concentrations of nitrogen in said plurality of second silicon nitride films are larger than 10% and smaller than 40%.

10. A liquid crystal display as claimed in claim 1, wherein the film thicknesses of said pluralities of first and third silicon nitride films and said pluralities of first and second silicon carbide films are larger than 30 Å and smaller than 500 Å, and the film thicknesses of said plurality of second silicon nitride films are larger than 500 Å and smaller than 3000 Å.

11. A liquid crystal display comprising:
a lower substrate;
a plurality of first electrodes formed on said lower substrate;
a plurality of impurity-doped first silicon nitride films formed on said plurality of first electrodes;
a plurality of undoped second silicon nitride films formed on said plurality of first silicon nitride films;
a plurality of third silicon nitride films doped with said impurity formed on said plurality of second silicon nitride films;
a plurality of second electrodes formed on said plurality of third silicon nitride films and covering side surfaces of said plurality of impurity-doped first silicon nitride films, said plurality of undoped second nitride films and said plurality of third silicon nitride films;
a plurality of pixel electrodes electrically connected respectively to said plurality of second electrodes, formed on said lower substrate;
a upper substrate formed above said lower substrate;
a transparent electrode formed on said upper substrate; and
a liquid crystal provided between said plurality of pixel electrodes and said transparent electrode.

12. A metal-insulator-metal element comprising:
a first electrode;
one of an impurity-doped first silicon nitride film and an impurity-doped first silicon carbide film formed on said first electrode;
a second silicon nitride film formed on said one of said first silicon nitride film and said first silicon carbide film;
one of a third silicon nitride film doped with said impurity and a second silicon carbide film doped with said impurity, formed on said second silicon nitride film; and
a second electrode formed on said one of said third silicon nitride film and said second silicon carbide film and covering side surfaces of said one of said impurity-doped first silicon nitride film and said impurity-doped first silicon carbide film, said second nitride film, and said one of said third silicon nitride film and said second silicon carbide film.

13. A metal-insulator-metal element as claimed in claim 12, wherein said second silicon nitride film is an undoped silicon nitride film.

14. A metal-insulator-metal element as claimed in claim 12, wherein said impurity is a p-type impurity such as boron.

15. A metal-insulator-metal element as claimed in claim 14, wherein said impurity is boron, a concentration of said boron being larger than 500 ppm and smaller than 1%.

16. A metal-insulator-metal element as claimed in claim 12, wherein said impurity is an n-type impurity such as phosphorus or arsenic.

17. A metal-insulator-metal as claimed in claim 16, wherein said impurity is phosphorus, a concentration of said phosphorus being larger than 100 ppm and smaller than 1%.

18. A metal-insulator-metal element as claimed in claim 12, wherein said impurity is a combination of a p-type impurity such as boron and an n-type impurity such as phosphorus or arsenic.

19. A metal-insulator-metal element as claimed in claim 18, wherein said impurity is a combination of boron and phosphorus, a concentration of the impurity being larger than 100 ppm and smaller than 1%.

20. A metal-insulator-metal element as claimed in claim 12, wherein concentrations of nitrogen of said first and third silicon nitride films are larger than 2% and smaller than 40%, concentrations of carbon of said first and second silicon carbide films are larger than 2% and smaller than 40%, and a concentration of nitrogen of said second silicon nitride film is larger than 10% and smaller than 40%.

21. A metal-insulator-metal element as claimed in claim 12, wherein film thicknesses of said first and third silicon nitride films and said first and second silicon carbide films are larger than 30 Å and smaller than 500 Å, and a thickness of said second silicon nitride film is larger than 500 Å and smaller than 3000 Å.

22. A metal-insulator-metal element comprising:
a first electrode;
an impurity-doped first silicon nitride film formed on said first electrode;
an undoped second silicon nitride film formed on said first silicon nitride film;
a third silicon nitride film doped with said impurity and formed on said second silicon nitride film; and
a second electrode formed on said third silicon nitride film and covering side surfaces of said impurity-doped first silicon nitride film, said undoped second silicon nitride film and said third silicon nitride film.

23. A liquid crystal display comprising:
a lower substrate;
a plurality of first electrodes formed on said lower substrate;
one of a plurality of impurity-doed first silicon nitride films and a plurality of impurity-doped first silicon carbide films, formed on said plurality of first electrodes;
a plurality of second silicon nitride films formed on said one of said plurality of first silicon nitride films and said plurality of first silicon carbide films;
one of a plurality of third silicon nitride films doped with said impurity and a plurality of second silicon carbide films doped with said impurity, formed on said plurality of second silicon nitride films;
a plurality of second electrodes formed on said one of said plurality of third silicon nitride films and said plurality of second silicon carbide films;
a plurality of pixel electrodes formed on said lower substrate, said pixel electrodes being electrically connected respectively to said plurality of second electrodes;
an upper substrate formed above said lower substrate;
a transparent electrode formed on said upper substrate; and a liquid crystal provided between said pixel electrodes and said transparent electrode, wherein said impurity is a p-type impurity such as boron and said impurity has a boron concentration larger than 500 ppm and smaller than 1%.

24. A liquid crystal display comprising:
a lower substrate;
a plurality of first electrodes formed on said lower substrate;
one of a plurality of impurity-doped first silicon nitride films and a plurality of impurity-doped first silicon carbide films, formed on said plurality of first electrodes;
a plurality of second silicon nitride films formed on said one of said plurality of first silicon nitride films and said plurality of first silicon carbide films;
one of a plurality of third silicon nitride films doped with said impurity and a plurality of second silicon carbide films doped with said impurity, formed on said plurality of second silicon nitride films;
a plurality of second electrodes formed on said one of said plurality of third silicon nitride films and said plurality of second silicon carbide films;
a plurality of pixel electrodes formed on said lower substrate, said pixel electrodes being electrically connected respectively to said plurality of second electrodes;
an upper substrate formed above said lower substrate;
a transparent electrode formed on said upper substrate; and
a liquid crystal provided between said pixel electrodes and said transparent electrode, wherein said impurity is an n-type impurity such as phosphorus and said impurity has a phosphorus concentration larger than 100 ppm and smaller than 1%.

25. A liquid crystal display comprising:
a lower substrate;
a plurality of first electrodes formed on said lower substrate;
one of a plurality of impurity-doped first silicon nitride films and a plurality of impurity-doped first silicon carbide films, formed on said plurality of first electrodes;
a plurality of second silicon nitride films formed on said one of said plurality of first silicon nitride films and said plurality of first silicon carbide films;
one of a plurality of third silicon nitride films doped with said impurity and a plurality of second silicon carbide films doped with said impurity, formed on said plurality of second silicon nitride films;
a plurality of second electrodes formed on said one of said plurality of third silicon nitride films and said plurality of second silicon carbide films;
a plurality of pixel electrodes formed on said lower substrate, said pixel electrodes being electrically connected respectively to said plurality of second electrodes;
an upper substrate formed above said lower substrate;
a transparent electrode formed on said upper substrate; and
a liquid crystal provided between said pixel electrodes and said transparent electrode, wherein said impurity is a combination of a p-type impurity such as boron and an n-type impurity comprising one of phosphorus and arsenic and said impurity has a concentration larger than 100 ppm and smaller than 1%.

26. A liquid crystal display comprising:
a lower substrate;
a plurality of first electrodes formed on said lower substrate;
one of a plurality of impurity-doped first silicon nitride films and a plurality of impurity-doped first silicon carbide films, formed on said plurality of first electrodes;
a plurality of second silicon nitride films formed on said one of said plurality of first silicon nitride films and said plurality of first silicon carbide films;
one of a plurality of third silicon nitride films doped with said impurity and a plurality of second silicon carbide films doped with said impurity, formed on said plurality of second silicon nitride films;
a plurality of second electrodes formed on said one of said plurality of third silicon nitride films and said plurality of second silicon carbide films;
a plurality of pixel electrodes formed on said lower substrate, said pixel electrodes being electrically connected respectively to said plurality of second electrodes;
an upper substrate formed above said lower substrate;
a transparent electrode formed on said upper substrate; and
a liquid crystal provided between said pixel electrodes and said transparent electrode, wherein said pluralities of first and third silicon nitride films have nitrogen concentrations larger than 2% and smaller than 40%, said pluralities of first and second silicon carbide films have carbon concentrations larger than 2% and smaller than 40%, and said plurality of second silicon nitride films have a nitrogen concentration larger than 10% and smaller than 40%.

27. A liquid crystal display comprising:
a lower substrate;
a plurality of first electrodes formed on said lower substrate;
one of a plurality of impurity-doped first silicon nitride films and a plurality of impurity-doped first silicon carbide films, formed on said plurality of first electrodes;
a plurality of second silicon nitride films formed on said one of said plurality of first silicon nitride films and said plurality of first silicon carbide films;
one of a plurality of third silicon nitride films doped with said impurity and a plurality of second silicon carbide films doped with said impurity, formed on said plurality of second silicon nitride films;
a plurality of second electrodes formed on said one of said plurality of third silicon nitride films and said plurality of second silicon carbide films;
a plurality of pixel electrodes formed on said lower substrate, said pixel electrodes being electrically connected respectively to said plurality of second electrodes;
an upper substrate formed above said lower substrate;
a transparent electrode formed on said upper substrate; and
a liquid crystal provided between said pixel electrodes and said transparent electrode, wherein said pluralities of first and third silicon nitride films and said pluralities of first and second silicon carbide films have film thicknesses larger than 30 Å and smaller than 500 Å, and said plurality of second silicon nitride films are larger than 500 Å and smaller than 3000 Å.

28. A metal-insulator-metal element comprising:

a first electrode;

one of an impurity-doped first silicon nitride film and an impurity-doped first silicon carbide film formed on said first electrode;

a second silicon nitride film formed on said one of said first silicon nitride film and said first silicon carbide film;

one of a third silicon nitride film doped with said impurity and a second silicon carbide film doped with said impurity, formed on said second silicon nitride film; and a second electrode formed on said one of said third silicon nitride film and said second silicon carbide film wherein said impurity is a p-type impurity such as boron and said impurity has a boron concentration larger than 500 ppm and smaller than 1%.

29. A metal-insulator-metal element comprising:

a first electrode;

one of an impurity-doped first silicon nitride film and an impurity-doped first silicon carbide film formed on said first electrode;

a second silicon nitride film formed on said one of said first silicon nitride film and said first silicon carbide film;

one of a third silicon nitride film doped with said impurity and a second silicon carbide film doped with said impurity, formed on said second silicon nitride film; and a second electrode formed on said one of said third silicon nitride film and said second silicon carbide film wherein said impurity is an n-type impurity such as phosphorus and said impurity has a phosphorus concentration larger than 100 ppm and smaller than 1%.

30. A metal-insulator-metal element comprising:

a first electrode;

one of an impurity-doped first silicon nitride film and an impurity-doped first silicon carbide film formed on said first electrode;

a second silicon nitride film formed on said one of said first silicon nitride film and said first silicon carbide film;

one of a third silicon nitride film doped with said impurity and a second silicon carbide film doped with said impurity, formed on said second silicon nitride film; and a second electrode formed on said one of said third silicon nitride film and said second silicon carbide film wherein said impurity is a combination of a p-type impurity such as boron and an n-type impurity such as phosphorus, and concentration of said impurity is larger than 100 ppm and smaller than 1%.

31. A metal-insulator-metal element comprising:

a first electrode;

one of an impurity-doped first silicon nitride film and an impurity-doped first silicon carbide film formed on said first electrode;

a second silicon nitride film formed on said one of said first silicon nitride film and said first silicon carbide film;

one of a third silicon nitride film doped with said impurity and a second silicon carbide film doped with said impurity, formed on said second silicon nitride film; and a second electrode formed on said one of said third silicon nitride film and said second silicon carbide film wherein said first and third silicon nitride films have concentrations of nitrogen larger than 2% and smaller than 40%, said first and second silicon carbide films have concentrations of carbon larger than 2% and smaller than 40%, and said second silicon nitride film has a concentration of nitrogen larger than 10% and smaller than 40%.

32. A metal-insulator-metal element comprising:

a first electrode;

one of an impurity-doped first silicon nitride film and an impurity-doped first silicon carbide film formed on said first electrode;

a second silicon nitride film formed on said one of said first silicon nitride film and said first silicon carbide film;

one of a third silicon nitride film doped with said impurity and a second silicon carbide film doped with said impurity, formed on said second silicon nitride film; and a second electrode formed on said one of said third silicon nitride film and said second silicon carbide film wherein said first and third silicon nitride films and said first and second silicon carbide films have film thicknesses larger than 30 Å and smaller than 500 Å, and said second silicon nitride film has a film thickness larger than 500 Å and smaller than 3000 Å.

* * * * *